US011252816B2

(12) United States Patent
Wu et al.

(10) Patent No.: US 11,252,816 B2
(45) Date of Patent: Feb. 15, 2022

(54) COMPOSITE WITH HOLLOW NANO-STRUCTURES AND APPLICATION THEREOF

(71) Applicant: National Chung Hsing University, Taichung (TW)

(72) Inventors: Tzong-Ming Wu, Taichung (TW); Fuh-Sheng Shieu, Taichung (TW); Wei-Ping Dow, Taichung (TW); Hong-Ta Yang, Taichung (TW); Jie-Mao Wang, Taichung (TW); Hsiang-Ting Wang, Taichung (TW)

(73) Assignee: National Chung Hsing University, Taichung (TW)

( * ) Notice: Subject to any disclaimer, the term of this patent is extended or adjusted under 35 U.S.C. 154(b) by 43 days.

(21) Appl. No.: 16/576,258

(22) Filed: Sep. 19, 2019

(65) Prior Publication Data

US 2020/0154565 A1 May 14, 2020

(30) Foreign Application Priority Data

Nov. 9, 2018 (TW) .................................. 107139846
Nov. 9, 2018 (TW) .................................. 107139857

(51) Int. Cl.
*B32B 7/02* (2019.01)
*H05K 1/03* (2006.01)

(52) U.S. Cl.
CPC ......... *H05K 1/0393* (2013.01); *H05K 1/0373* (2013.01); *H05K 2201/0141* (2013.01); *H05K 2201/0154* (2013.01); *H05K 2201/0209* (2013.01); *H05K 2201/0254* (2013.01)

(58) Field of Classification Search
CPC .. H05K 1/0366; H05K 1/0373; H05K 1/0393; H05K 2201/0141; H05K 2201/0154; H05K 2201/0209; H05K 2201/0254; H05K 2201/026
See application file for complete search history.

(56) References Cited

FOREIGN PATENT DOCUMENTS

| JP | 2007091848 A | 4/2007 |
| JP | 2015067739 A | 4/2015 |
| TW | I488739 B | 6/2015 |

*Primary Examiner* — Lawrence D Ferguson
(74) *Attorney, Agent, or Firm* — Alan D. Kamrath; Karin L. Williams; Mayer & Williams PC

(57) ABSTRACT

A composite with hollow nano-structures includes multiple one dimensional hollow nanowires being dispersed into a polymer film. The polymer film is flexible, a dielectric constant of the one dimensional hollow nanowire is lower than a dielectric constant of the polymer film, and a dielectric constant of the composite is between the dielectric constant of the one dimensional hollow nanowire and the dielectric constant of the polymer film.

14 Claims, 10 Drawing Sheets

COMPOSITE WITH HOLLOW NANO-STRUCTURES AND APPLICATION THEREOF

BACKGROUND OF THE INVENTION

1. Field of the Invention

The present invention relates to composite, and more particularly to a composite with hollow nano-structures for a decreased dielectric property, such as a dielectric constant or dissipation factor.

2. Description of Related Art

Giving credit to the conveniences portable consumer electronic products may bring to consumers for working in any desired working environment and to the increased efficiency of working, these portable consumer electronic products have become more and more popular in recent years. The requirements of portable consumer electronic products depend not only performance, but also on appearance, such as being light weight, thin, short, small or even flexible. These are key points that influence how a consumer will accept these kinds of consumer electronic products. Therefore, development of light weight portable products is an important part in modern science and technology.

A printed circuit board (PCB) takes a great proportion of the total weight in portable consumer electronic products, such as a mobile phone, personal computer (PC) or tablet. Researchers focus on reducing the weight for such portable consumer electronic products but still retaining its flexible ability and high efficiency. A Material of flexible PCB, such as polyimide, is commonly used in flexible copper clade laminate (FCCL) and flexible coverlay. It is also widely used in advanced flexible PCB, electronic communication technology, photoelectric display or any other related industries. Demands of these technologies or industries applied with a high frequency circuit are all about the speed and quality of signal transmission. The main factors affecting said speed and quality is the electrical characteristics of the material, namely the dielectric constant (Dk) and dissipation factor (DF). However, the aforementioned polyimide has problems of exceeding dissipation factor and dielectric constant in such fields. Improving the transmission rate of the material and still maintaining signal integrity has become a big issue. This normally can be improved by reducing the dielectric constant and dissipation factor of the material for achieving a shortened signal propagation delay time, enhanced signal transmission speed and reduced signal transmission loss. Nevertheless, there is still no composite that can still maintain the flexible ability and high efficiency while maintaining its light weight. It is necessary to have a composite that will overcome or substantially ameliorate at least one or more of the deficiencies of the prior art, or to at least provide an alternative solution to the problems.

It is to be understood that, if any prior art information is referred to herein, such reference does not constitute an admission that the information forms part of the common general knowledge in the art.

SUMMARY OF THE INVENTION

In order to solve shortcomings of lacking a suitable composite with flexible ability, high efficiency and light weight, the present invention is required.

The present invention is related to a composite with hollow nano-structures having: multiple one dimensional hollow nanowires being dispersed into a polymer film; the polymer film is flexible; a dielectric constant of the one dimensional hollow nanowire is lower than a dielectric constant of the polymer film; and a dielectric constant of the composite is between the dielectric constant of the one dimensional hollow nanowire and the dielectric constant of the polymer film.

According to above description, the present invention has advantages as follows.

1. Electronic products will continue to develop in directions of high performance and light weight in the future. PCB carried with various electronic components must be upgraded to meet the demands of high frequency signal transmission and portable products. By introducing hollow structures in the present invention and utilizing flexible polymer, the present invention can achieve the goals of light weight and decreased dielectric constant, and also can be used in wearable electronics demanding both flexibility and elasticity.

2. By introducing hollow structures with low density, low heat conduction coefficient, large surface area, easy modification, good mechanical stability and low toxicity into the flexible PCB material, the present invention not only can reduce the weight of the structure, but also can enhance the structure. This can lead to the advantages of low cost, light weight and decreased dielectric constant and dissipation factor.

Many of the attendant features and advantages of the present invention will become better understood with reference to the following detailed description considered in connection with the accompanying figures and drawings.

DETAILED DESCRIPTION OF PREFERRED EMBODIMENT

Figure 1A:
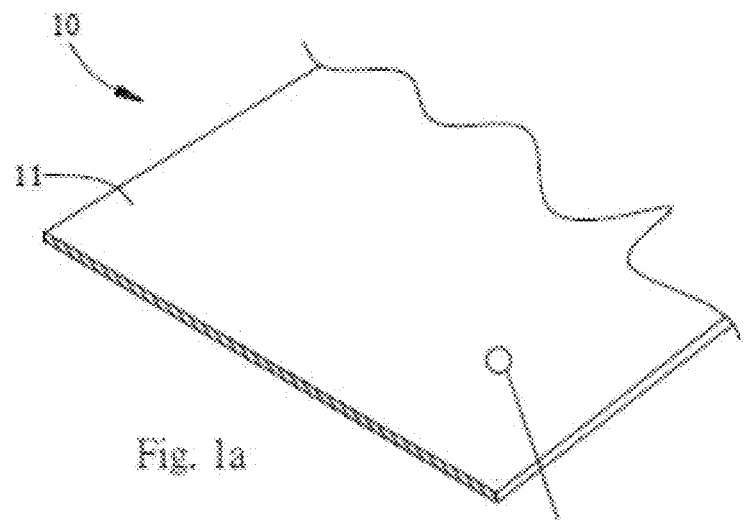
FIG. 1a and FIG. 1b are perspective view of the first embodiment of the composite with hollow nano-structures in accordance with the present invention.

Reference will now be made in detail to the present preferred embodiments of the invention, examples of which are illustrated in the accompanying drawings. Wherever possible, the same reference numbers are used in the drawings and the description to refer to the same or like parts. It is not intended to limit the method by the exemplary embodiments described herein. In the following detailed description, for purposes of explanation, numerous specific details are set forth in order to attain a thorough understanding of the disclosed embodiments. It will be apparent, however, that one or more embodiments may be practiced without these specific details. As used in the description herein and throughout the claims that follow, the meaning of "a", "an", and "the" may include reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "film" will be understood as not particularly to film structure, but also referred to membrane, board, plate and other substantially flat structure. As used in the description herein and throughout the claims that follow, the meaning of "electrical property" or "electrical characteristic" may be referred but not limited to dielectric constant (Dk) and dissipation factor (DF) of a material.

Figure 1B:
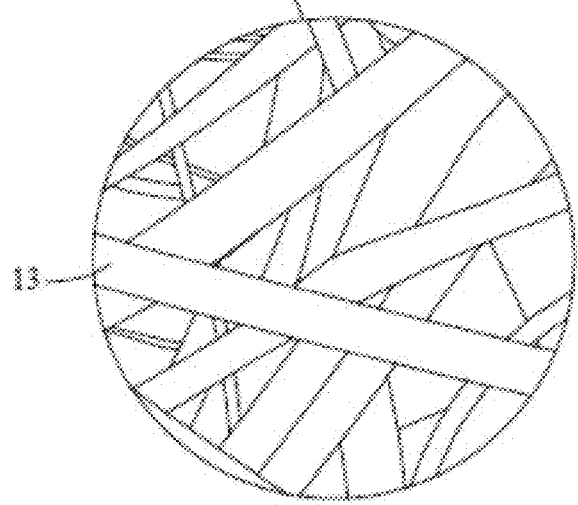

With reference to FIG. 1a and FIG. 1b, a composite 10 with hollow nano-structures is provided. A first embodiment of the composite 10 comprises multiple one dimensional hollow nanowires 13 being dispersed into a polymer film 11. The one dimensional hollow nanowires 13 can reduce electrical properties or electrical characteristics of the polymer film 11. More specifically, the one dimensional hollow nanowires 13 can make the composite having its electrical properties or electrical characteristics between the electrical properties or electrical characteristics of the polymer film 11 and the electrical properties or electrical characteristics of the one dimensional hollow nanowires 13. The electrical properties or electrical characteristics include but not limited to dielectric constant (Dk) and dissipation factor (DF).

Material of the said polymer film 11 may be Polyimide (PI) or Liquid Crystal Polymer (LCP). Material of the said one dimensional hollow nanowires 13 may be silicon dioxide ($SiO_2$), tin oxide ($SnO_2$), cobalt manganate ($CoMn_2O_4$) or iron oxide cobalt ($CoFe_2O_4$).

To be specific, in the first embodiment of the composite 10 in present invention, the material of the polymer film 11 may be Polyimide (PI) and the material of the one dimensional hollow nanowires 13 may be silicon dioxide ($SiO_2$). A production method of the first embodiment of the present invention is provided as follows.

Figure 2:
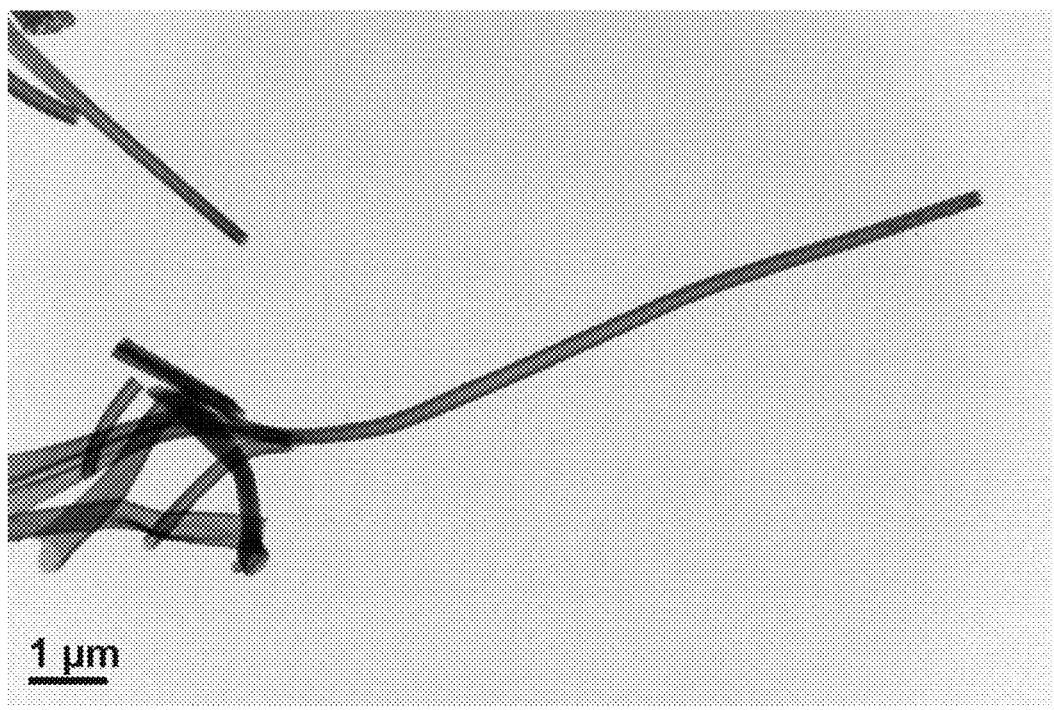
FIG. 2 is a SEM image of the one dimensional hollow nanowires in accordance with the present invention.

With reference to FIG. 2, a SEM image of the one dimensional hollow nanowires 13 in the first embodiment is provided. A diameter of the one dimensional hollow nanowire is at a range of 50 to 100 nm. The one dimensional hollow nanowire 13 is preferred to be produced by an electrostatic spinning method. For example, the electrostatic spinning method can be achieved by applying electric charge onto an electrospun solution and pulling the electrospun solution between two electric fields. During this process, the electrospun solution will gradually refine and become the one dimensional hollow nanowire 13 as a solvent in the electrospun solution being volatilized naturally or further by a heating mean. The electrospun solution of this embodiment is preferable of having a precursor like tetraethyl orthosilicate (TEOS) and a polymer like Poly-vinylpyrrolidone (PVP). TEOS/PVP complex nanowires may be obtained by the aforementioned electrostatic spinning method. Further, by heating the TEOS/PVP complex nanowires for removing the polymer, the one dimensional hollow nanowire 13 can be successfully obtained.

The composite 10 can be obtained by blending the one dimensional hollow nanowire 13 with the polyimide to form a suspension solution and further forming into film shape. Aforementioned forming method of the film may be achieved by Doctor Blade Coating method. The doctor blade coating method can be performed by placing a fixed knife (or stationary blade) vertically on a coating platform, placing the suspension solution on the coating platform on the other side of the fixed knife and towing the platform at a constant speed by an injection pump. The fixed knife will spread and coat the suspension solution evenly on the coating platform. During this process, the fixed knife will provide the suspension solution a unidirectional shear force which allows the one dimensional hollow nanowire 13 to be aligned in the said suspension solution. It even enables the one dimensional hollow nanowire 13 to be substantially aligned in same direction in the composite 10. After the doctor blade coating method, the spread suspension solution can be cured to form into a solid film. The composite 10 of the present invention has flexibility due to the flexible material of the polymer film 11 which can make the present invention suitable for applying on a substrate or PCB.

The one dimensional hollow nanowire 13 of the present invention can actually change the electrical properties of the polymer film 11, or even can regulate the electrical properties of the polymer film 11 by changing an inner and an outer diameter ratio of the one dimensional hollow nanowire 13. The original Dk of each material in the first embodiment of the present invention is shown in below chart 1. The aforementioned original Dk of the material means the individual Dk of the material before becoming the composite 10 of the present invention.

CHART 1

| Material | PI | $SiO_2$ | Air |
| --- | --- | --- | --- |
| Dk value | 3.3 | 3.9 | 1 |

According to the chart 1, the actual Dk of the composite 10 in the present invention can be obtained by a general formula as follows.

$$\frac{\text{Polymer (Volume} * Dk) + \text{One dimensional hollow nanowire } (Volumn * Dk)}{\text{Volume of the composite}}$$

Since the nanowire of the present invention has hollow structure, the Dk of the air in the hollow structure should be also considered in the calculation. To calculate the Dk of the composite 10 with the one dimensional hollow nanowire 13 and the polymer (PI), the following calculation may be further applied. Because the present invention adopts the doctor blade coating method, it is predictable that the one dimensional hollow nanowire 13 will lie flat in the composite 10 due to the unidirectional shear force applied by the fixed knife. The distribution of the one dimensional hollow nanowire 13 in the composite 10 will rarely appear in perpendicular direction from a plane direction of the composite 10. Hence, the above general formula can be further modified as below formula (I) by MGI-AI platform calculation.

$$\varepsilon_{c1} = \varepsilon_p + \frac{V_1}{\frac{1}{\varepsilon_1 - \varepsilon_p} + \frac{V_p}{2\varepsilon_p}} \quad \text{Formula (I)}$$

In the formula (I), the "$\varepsilon_{c1}$" represents the Dk of the composite 10. The "$V_p$" and "$V_1$" in formula (I) represent the volume fraction of the polymer and the one dimensional hollow nanowire 13 respectively. The "$\varepsilon_p$" and "$\varepsilon_1$" in formula (I) represent the Dk of the polymer and the one dimensional hollow nanowire 13 respectively.

The actual Dk of the one dimensional hollow nanowire 13 in the first embodiment in the present invention can be obtained by following formula (II) wherein "$R_2$" represents the outer diameter of the nanowire, "$R_1$" represents inner diameter of the nanowire, "L" represents length of the nanowire, "A" equals $R_1/R_2$ and "$R_1^2$" equals $AR_2^2$.

$$\frac{\text{Volume of SiO}_2 * Dk \text{ of SiO}_2 + \text{Volume of Air} * Dk \text{ of Air}}{\text{Volume of the nano wire}} =$$

$$\frac{1 \times (A^2 \pi R_2^2 L) + 3.9 \times (\pi R_2^2 L(1 - A^2))}{\pi R_2^2 L} = 3.9 - 2.9 A^2 \quad \text{Formula (II)}$$

Figure 3:
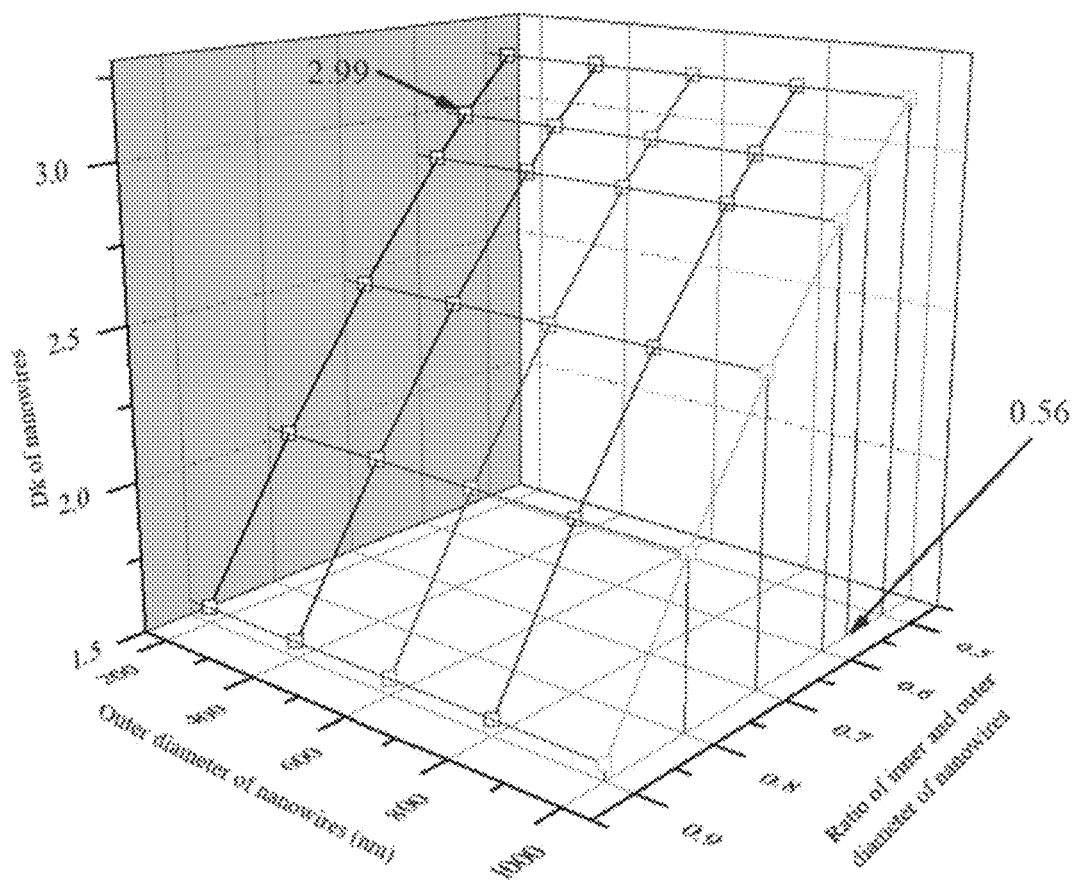
FIG. 3 and FIG. 4 are figures for showing ratio of the Dk, the outer diameter, ratio of inner and outer diameter of the one dimensional hollow nanowires in accordance with the present invention.
Figure 4:
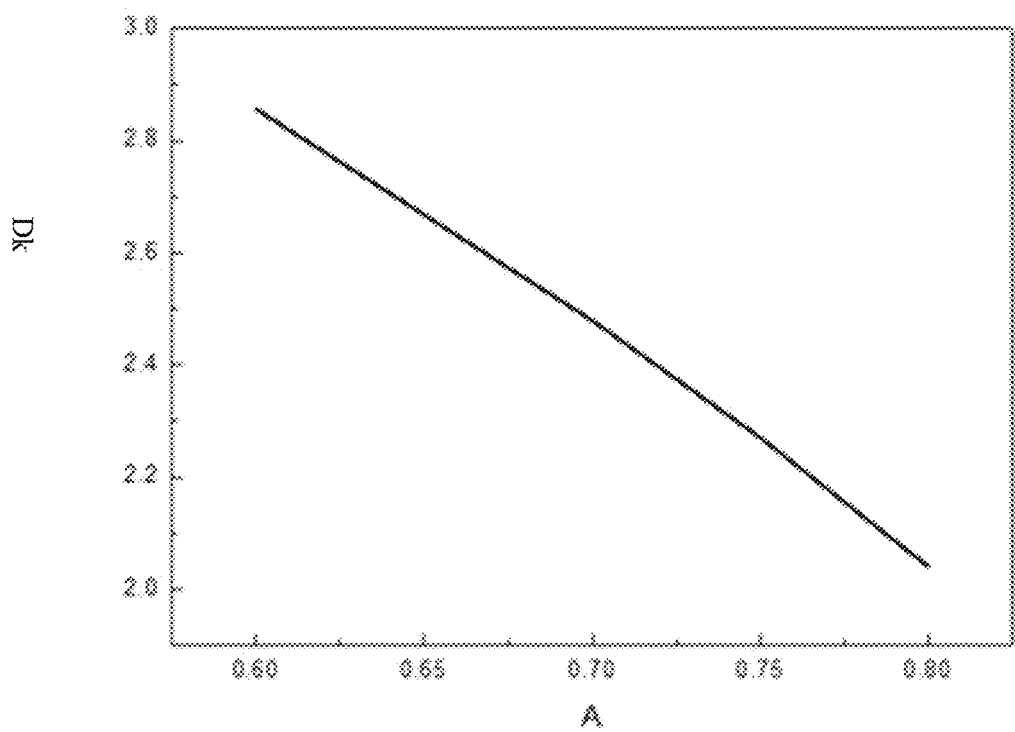

Therefore, with reference to FIG. 3, FIG. 4 and above formula (I) and (II), it can be proved that the Dk of the one dimensional hollow nano wire 13 has no contribution with its size (outer diameter) or length but only related to the ratio of its inner diameter and outer diameter (or also called wall thickness of the nanowire). The Dk of the composite 10 of the present invention can be regulated or changed by simply controlling the wall thickness of the nanowire of the one dimensional hollow nano wire 13 without changing its size (outer diameter) or length.

Also, as proven by the aforementioned FIG. 3, FIG. 4, formula (I) and (II), the Dk of the composite 10 won't be affected by the length of the one dimensional hollow nano wire 13 when the wall thickness of the nanowire remain the same. This means that the one dimensional hollow nanowire 13 can maintain the same Dk and its hollow structure even if it breaks during the film forming process described above and also enable a decreased Dk of the composite 10 in the present invention.

Figure 5:
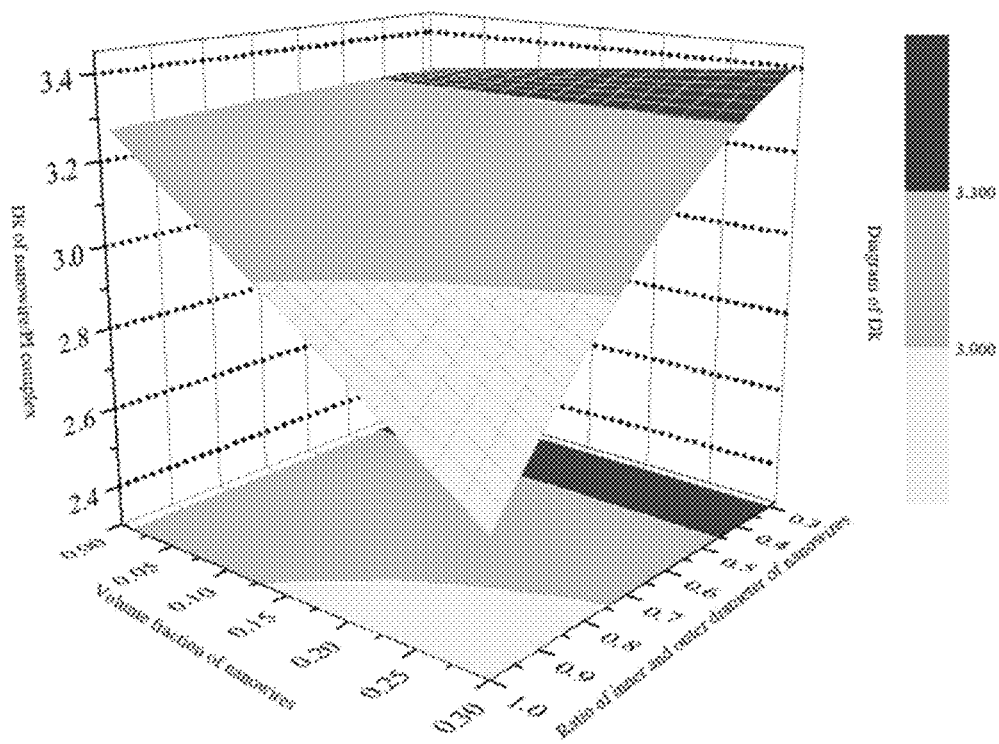
FIG. 5 is a figure for showing ratio of the Dk of the nanowire/PI (the composite), volume fraction and the ratio of the inner and outer diameter of the one dimensional hollow nanowires in accordance with the present invention.

With reference to FIG. 5, a figure for showing the Dk of the composite 10, the volume fraction and ratio of inner diameter and outer diameter of the one dimensional hollow nanowire 13 is provided. According to above calculation and FIG. 5, the one dimensional hollow nanowire 13 can actually cause a decreased Dk of the composite 10 in the present invention. Thus, another approach of the present invention is that the Dk of the composite 10 with hollow nano structure can be regulated by simply adjusting the wall thickness of the one dimensional hollow nanowire 13 without increasing the amount of the hollow nano structures in the composite 10.

Figure 6A:
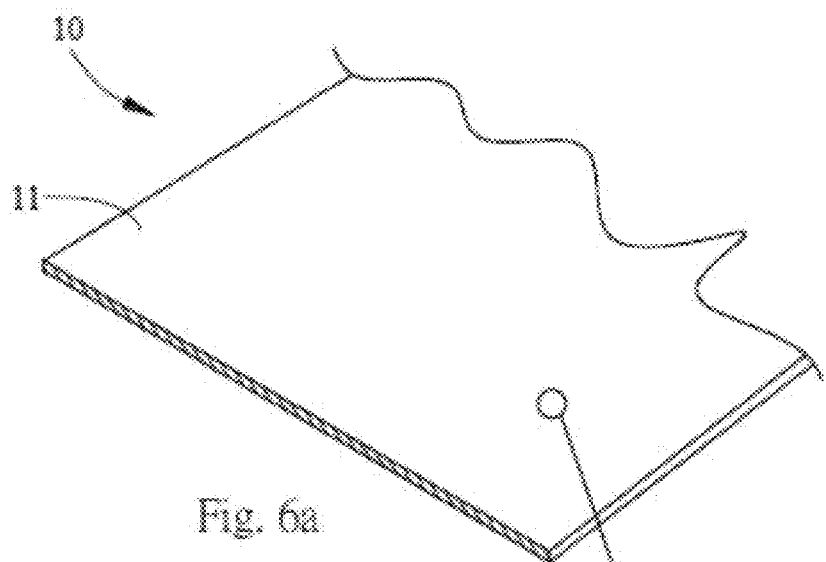
FIG. 6a and FIG. 6b are perspective view of the second embodiment of the composite with hollow nano-structures in accordance with the present invention.
Figure 6B:
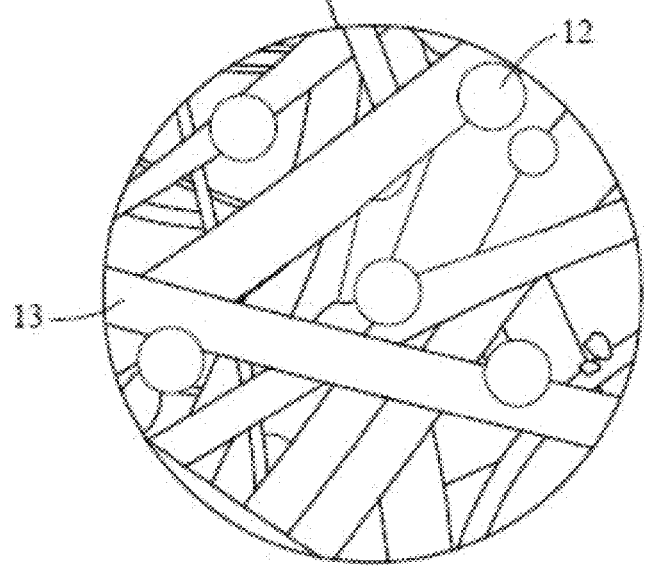

With reference to FIG. 6a and FIG. 6b, the second embodiment of the present invention is provided. The composite 10 comprises multiple zero dimensional hollow nanospheres 12 and multiple one dimensional hollow nanowires 13 being dispersed in the polymer film 11. Likewise, the zero dimensional hollow nanospheres 12 and the multiple one dimensional hollow nanowires 13 can reduce electrical properties or electrical characteristics of the polymer film 11. More preferably or specifically, the zero dimensional hollow nanospheres 12 and the multiple one dimensional hollow nanowires 13 can make the composite 10 having its electrical properties or electrical characteristics between the electrical properties or electrical characteristics of the polymer film 11 and the electrical properties or electrical characteristics of the zero dimensional hollow nanospheres 12 and the multiple one dimensional hollow nanowires 13. The electrical properties or electrical characteristics include but not limited to dielectric constant (DK) and dissipation factor (DF).

Material of the said zero dimensional hollow nanospheres 12 may be silicon dioxide ($SiO_2$), tin oxide ($SnO_2$), cobalt manganate ($CoMn_2O_4$) or iron oxide cobalt ($CoFe_2O_4$).

To be specific, in the second embodiment of the composite 10 of the present invention, the material of the polymer film 11 may be Polyimide (PI) and the material of the zero dimensional hollow nanospheres 12 and the one dimensional hollow nanowires 13 may be silicon dioxide ($SiO_2$). A production method of the second embodiment of the present invention is provided as follows.

Figure 7:
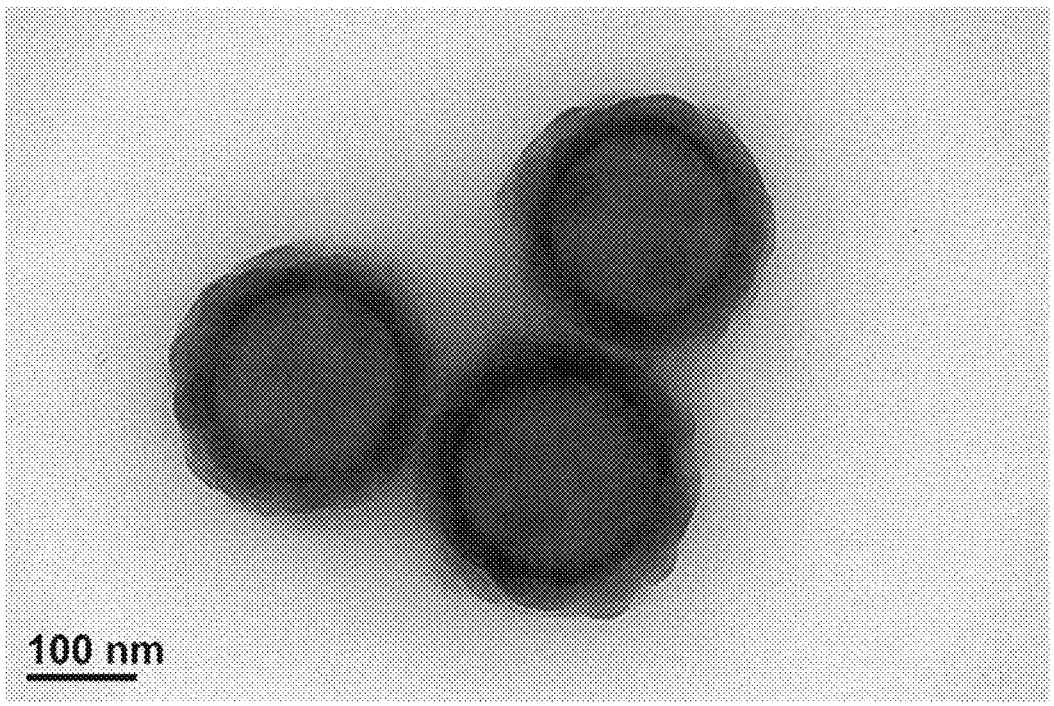
FIG. 7 is a SEM image of the zero dimensional hollow nanospheres in accordance with the present invention.

With reference to FIG. 7, a SEM image of the zero dimensional hollow nanospheres 12 is provided. The diameter of the zero dimensional hollow nanospheres 12 is at a range of 50~1000 nm. The zero dimensional hollow nanospheres 12 of the present invention can be produced by a template-free synthesis method or template synthesis method. More preferably, the zero dimensional hollow nanosphere 12 of the present invention is produced by the template synthesis method for a better controlled shape and size of the zero dimensional hollow nanospheres 12. The template synthesis method can further comprise a soft template synthesis method and hard template synthesis which are both suitable for the present invention.

The process of the soft template synthesis method is stated as follows: (1) A surfactant, hexadecane trimethylammonium bromide (CTAB), is dispersed in a solvent to form micelles. At the same time, silicon precursor ions, tetraethylsilicate (TEOS), attach on functional groups of the micelles. (2) Providing energy to facilitate the silicon precursor ions to react with surface of the micelles. Due to concentration difference in the solution, the silicon precursor ions will gradually diffuse to participate in the reaction and form core shell structure. (3) Removing the surfactant by another solvent or heating, the zero dimensional hollow nanospheres 12 thus can be obtained.

The process of the hard template synthesis method is achieved by (1) synthesizing template by any conventional technique, (2) modifying surface of the template, (3) synthesizing or reducing the target material on the surface of the template, and (4) removing the template. The so-called hard template synthesis method does not refer to the template with high hardness, but refers to the shape of the template being fixed or not easy to change, which can be used to prepare hollow spherical shell structures by different materials. Hard template synthesis can comprise various techniques. Taking layer by layer assembly technique as an example, a polymer material with opposite charges can be continuously deposited on the surface of the template. By electrostatic interaction, layered spherical structure can be obtained after removing the template by any suitable solvent. The size, shape, composition, shell thickness (or wall thickness) and porosity of hollow structure can be easily controlled by this hard template synthesis method The composite 10 can be obtained by blending the zero dimensional hollow nanospheres 12 and the one dimensional hollow nanowire 13 with the polyimide to form a suspension solution and further forming into film shape.

Aforementioned forming method of the film may be achieved by Doctor Blade Coating method which can be performed by placing a fixed knife (or stationary blade) vertically on a coating platform, placing the suspension solution on the coating platform on the other side of the fixed knife and towing the platform at a constant speed by an injection pump. The fixed knife will spread the suspension solution to evenly coat on the coating platform. During the process, the fixed knife will provide the suspension solution with a unidirectional shear force which allows the zero dimensional hollow nanospheres 12 and the one dimensional hollow nanowire 13 to be aligned in the said suspension solution. This even enables the one dimensional hollow nanowire 13 to be substantially aligned in same direction in the composite 10. After the doctor blade coating method, the spread suspension solution can be cured to form into the solid film. The composite 10 of the present invention has flexible ability due to the flexible material of the polymer film 11 which makes the present invention suitable for applying on a substrate or PCB.

The zero dimensional hollow nanospheres 12 and the one dimensional hollow nanowire 13 of the present invention can actually change the electrical properties of the polymer film 11, or even can regulate the electrical properties of the polymer film 11 by changing an inner and an outer diameter ratio of the zero dimensional hollow nanosphere 12 and the one dimensional hollow nanowire 13. The original Dk of each material in the second embodiment of the present invention is shown in below chart 2. The aforementioned original Dk of the material means the individual Dk of the material before becoming the composite 10 of the present invention.

CHART 2

| Material | PI | SiO$_2$ | Air |
|---|---|---|---|
| Dk value | 3.3 | 3.9 | 1 |

According to the chart 1, the actual Dk of the composite 10 of the second embodiment in the present invention can be obtained by a general formula as follows.

$$\frac{\text{Polymer (Volume} * Dk) + 1D \text{ nanowire. } 0D \text{ nanosphere (Volumn } * Dk)}{\text{Volume of the composite}}$$

Since the nanowire and nanosphere of the present invention have a hollow structure, the Dk of the air in the hollow structure should be also considered in the calculation. Formulas (III) and (IV) are calculations of Dk for the zero dimensional hollow nanospheres 12 and the Dk of the composite/complex with the zero dimensional hollow nanospheres 12 and the polymer respectively according to General Lichterecker mixing rule by MGI-AI platform calculation.

The "$\varepsilon_{(x)}$"-in formula (III) represents the Dk of the zero dimensional hollow nanospheres 12. The "$V_{air}$" and "$V_s$" in formula (III) represent the volume fraction of the air and the SiO$_2$ respectively. The "$\varepsilon_{air}$" and "$\varepsilon_s$" in formula (III) represent the Dk of the air and the SiO$_2$ respectively. The "$V_{c0}$" in formula (IV) represents the Dk of the complex of the zero dimensional hollow nanospheres 12 and the polymer film 11. The "$V_p$" and "$V_0$" in formula (IV) represent the volume fraction of the polymer and the zero dimensional hollow nanospheres 12 respectively. The "$\varepsilon_p$" and "$\varepsilon_0$" in formula (IV) represent the Dk of the polymer and the zero dimensional hollow nanospheres 12 respectively.

$$\varepsilon_{(x)} = V_{air}\varepsilon_{air} + V_s\varepsilon_s \quad \text{Formula (III)}=$$

$$\varepsilon_{c0} = V_p\varepsilon_p + V_0\varepsilon_0 \quad \text{Formula (IV)}$$

Further according to Formulas II, III and IV, the Dk of the composite 10 with the zero dimensional hollow nanospheres 12 and the one dimensional hollow nanowire 13 dispersed in the polymer can be calculated by the below Formula (V) according to General Lichterecker mixing rule by MGI-AI platform calculation.

$$\varepsilon_m = V_{c0}\varepsilon_{c0} + V_{c1}\varepsilon_{c1} \quad \text{Formula (V)}$$

The "$V_{c0}$" and "$V_{c1}$" in the formula V represent the volume fraction of the polymer and the zero dimensional hollow nanospheres 12 respectively.

Figure 8:
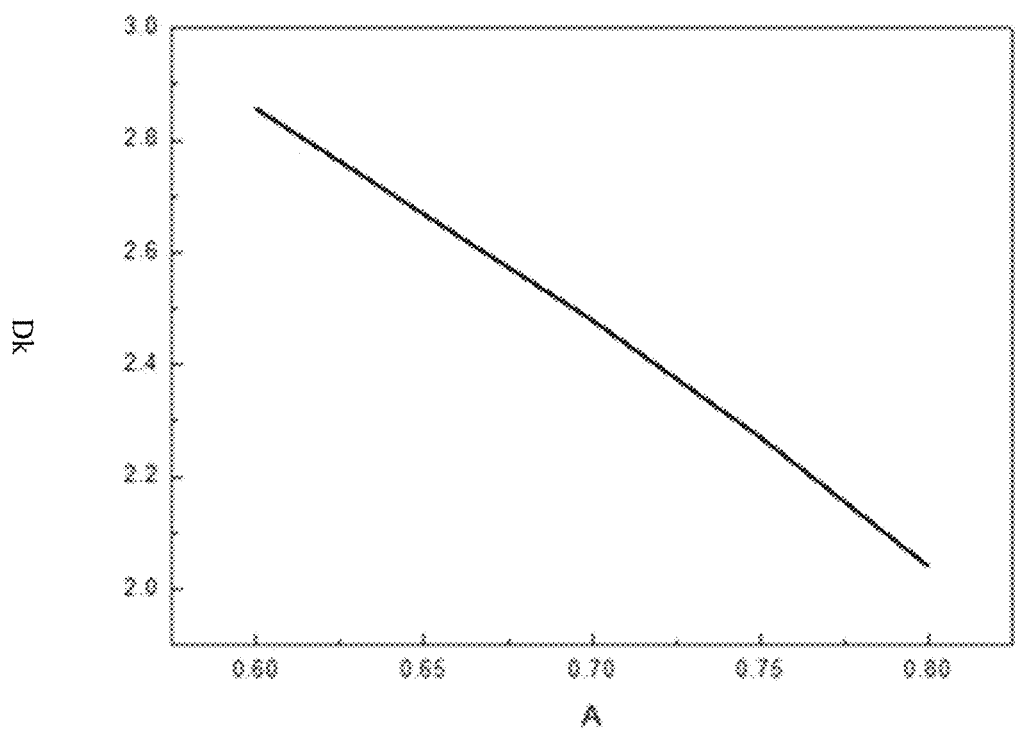
FIG. 8 is a figure for showing ratio of the Dk and the inner and outer diameter of the zero dimensional hollow nanospheres in accordance with the present invention.
Figure 9:
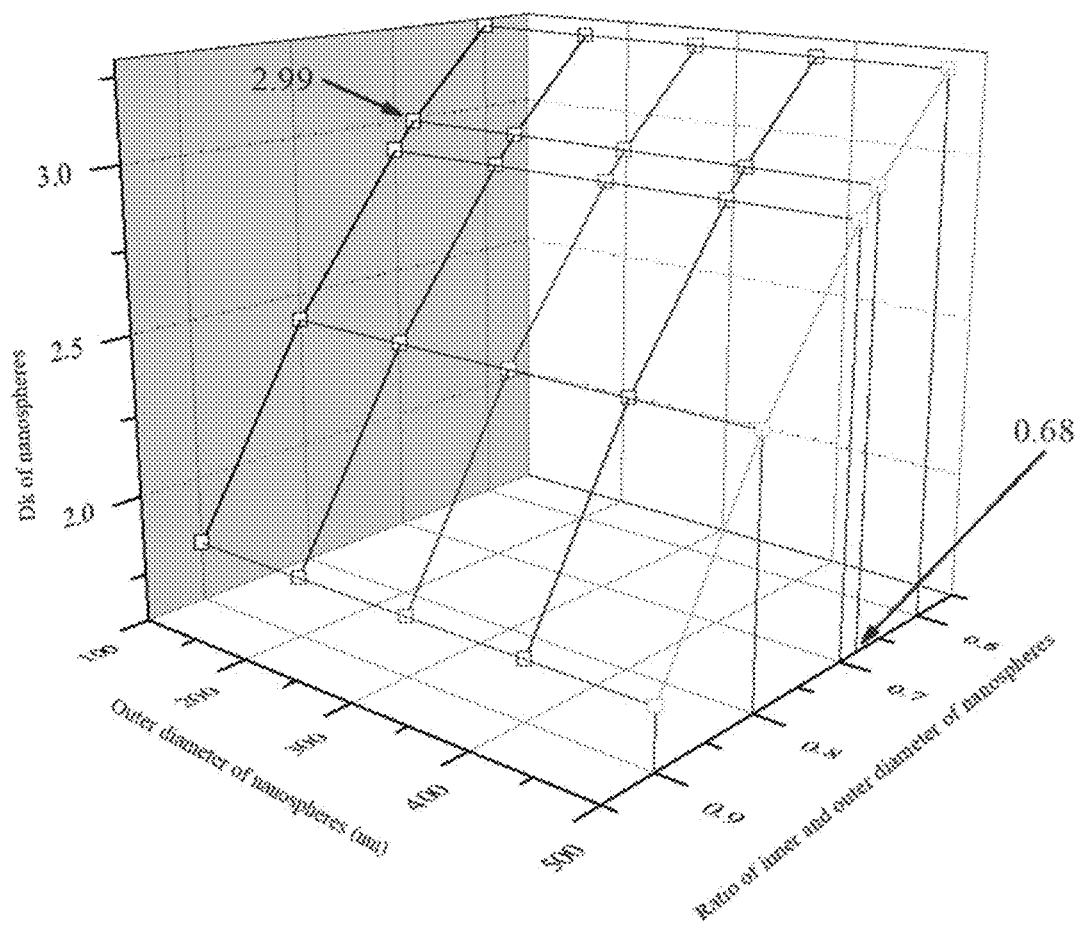
FIG. 9 is a figure for showing ratio of the Dk, the outer diameter, ratio of inner and outer diameter of the zero dimensional hollow nanospheres in accordance with the present invention.
Figure 10:
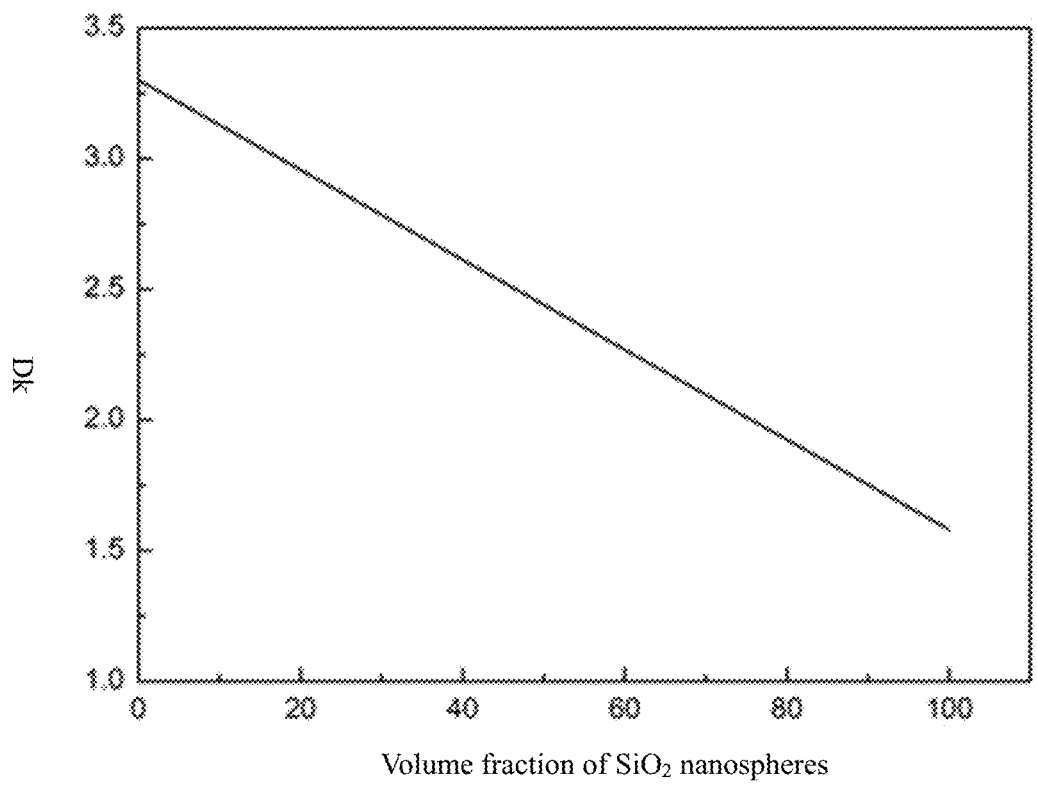
FIG. 10 is a figure for showing ratio of the Dk and volume fraction of $SiO_2$ zero dimensional hollow nanospheres in accordance with the present invention.

With reference to FIG. 8, FIG. 9 and FIG. 10, the actual Dk of the zero dimensional hollow nanospheres 12 in the second embodiment in the present invention can be obtained by following formula (VI) wherein the "$R_2$" represents the outer diameter of the nanosphere, "$R_1$" represents inner diameter of the nanosphere, "A" equals $R_1/R_2$ and "$R_1$" equals $AR_2$.

$$\frac{1 \times \frac{4}{3}\pi\left(\frac{AR_2}{2}\right)^3 + 3.9 \times \left(\frac{4}{3}\pi\left(\frac{R_2}{2}\right)^3(1 - A^3)\right)}{\frac{4}{3}\pi\left(\frac{R_2}{2}\right)^3} = 3.9 - 2.9A^3 \quad \text{Formula (VI)}$$

Therefore, with reference to FIG. 8, FIG. 9, FIG. 10 and the above formulas III, IV, V and VI, it can be proven that the Dk of the zero dimensional hollow nanospheres 12 has no contribution with its size (outer diameter) but is only related to the ratio of its inner diameter and outer diameter (or it can be called the wall thickness of the nanosphere). The Dk of the composite 10 of the present invention can be regulated or changed by simply controlling the wall thickness of the nanosphere of the zero dimensional hollow nanospheres 12 without changing its size or its outer diameter.

In the second embodiment, the Dk value of PI (polymer) and Silicon dioxide (zero dimensional hollow nanospheres 12 and one dimensional hollow nanowire 13) are 3.3 and below 3.3 according to above calculation, the Dk of the composite will gradually decrease when the amount of the zero dimensional hollow nanospheres 12 and the one dimensional hollow nanowire 13 increase as shown in FIG. 5 and FIG. 9.

Also, as proven by the aforementioned FIG. 3~9 and formula (I)~(VI), the Dk of the composite 10 will be affected by the existence of the zero dimensional hollow nanospheres 12 and the one dimensional hollow nanowire 13. This means that the zero dimensional hollow nanospheres 12 and the one dimensional hollow nanowire 13 can maintain at same Dk value and its hollow structure even if it breaks during the film forming process described above, and also enable a decreased Dk of the composite 10 in the present invention. Thus, another approach of the present invention is that the Dk of the composite 10 with hollow nano structures can be regulated by simply adjusting the wall thickness of the zero dimensional hollow nanospheres 12 and the one dimensional hollow nanowire 13 without adjusting the amount of these hollow nano structures in the composite 10.

The above specification, examples, and data provide a complete description of the present disclosure and use of exemplary embodiments. Although various embodiments of the present disclosure have been described above with a certain degree of particularity, or with reference to one or more individual embodiments, those with ordinary skill in the art could make numerous alterations or modifications to the disclosed embodiments without departing from the spirit or scope of this disclosure.

What is claimed is:

1. A composite with hollow nano-structures comprising:
    multiple one dimensional hollow nanowires being dispersed into a polymer film;
    the polymer film is flexible and material of the polymer film comprises Polyimide or Liquid Crystal Polymer;
    a dielectric constant of the one dimensional hollow nanowire is lower than a dielectric constant of the polymer film; and
    a dielectric constant of the composite is between the dielectric constant of the one dimensional hollow nanowire and the dielectric constant of the polymer film.

2. The composite with hollow nano-structures as claimed in claim 1, wherein multiple zero dimensional hollow nanospheres are further dispersed in the polymer film;
    a dielectric constant of the one dimensional hollow nanowire and the zero dimensional hollow nanosphere are lower than the dielectric constant of the polymer film; and
    the dielectric constant of the composite is between the dielectric constant of the one dimensional hollow nanowire, the zero dimensional hollow nanosphere and the dielectric constant of the polymer film.

3. The composite with hollow nano-structures as claimed in claim 2, wherein material of the one dimensional hollow nanowire and the zero dimensional hollow nanosphere comprises silicon dioxide, tin oxide, cobalt manganate or iron oxide cobalt.

4. The composite with hollow nano-structures as claimed in claim 1, wherein material of the one dimensional hollow nanowire and the zero dimensional hollow nanosphere comprises silicon dioxide, tin oxide, cobalt manganate or iron oxide cobalt.

5. The composite with hollow nano-structures as claimed in claim 1, wherein a ratio of an inner diameter and an outer diameter of the one dimensional hollow nanowire is inversely proportional to the dielectric constant of the composite.

6. The composite with hollow nano-structures as claimed in claim 2, wherein a ratio of an inner diameter and an outer diameter of the one dimensional hollow nanowire and the zero dimensional hollow nanosphere is inversely proportional to the dielectric constant of the composite.

7. The composite with hollow nano-structures as claimed in claim 6, wherein a ratio of an inner diameter and an outer diameter of the one dimensional hollow nanowire and the zero dimensional hollow nanosphere is inversely proportional to the dielectric constant of the composite.

8. The composite with hollow nano-structures as claimed in claim 1, wherein when the material of the one dimensional hollow nanowire and the zero dimensional hollow nanowire is silicon dioxide, the dielectric constant of the one dimensional hollow nanowire and the zero dimensional hollow is less than 3.9.

9. A flexible printable circuit board having the composite with hollow nano-structures as claimed in claim 1.

10. A flexible printable circuit board having the composite with hollow nano-structures as claimed in claim 2.

11. A flexible printable circuit board having the composite with hollow nano-structures as claimed in claim 3.

12. A flexible printable circuit board having the composite with hollow nano-structures as claimed in claim 5.

13. A flexible printable circuit board having the composite with hollow nano-structures as claimed in claim 6.

14. A flexible printable circuit board having the composite with hollow nano-structures as claimed in claim 8.

* * * * *